United States Patent
Kang

(10) Patent No.: US 7,639,310 B2
(45) Date of Patent: Dec. 29, 2009

(54) DIGITAL BROADCASTING RECEIVER AND A RECEPTION METHOD THEREOF

(75) Inventor: Eun-young Kang, Suwon-si (KR)

(73) Assignee: Samsung Electronics Co., Ltd, Suwon-si (KR)

(*) Notice: Subject to any disclaimer, the term of this patent is extended or adjusted under 35 U.S.C. 154(b) by 575 days.

(21) Appl. No.: 10/978,371

(22) Filed: Nov. 2, 2004

(65) Prior Publication Data
US 2005/0100053 A1 May 12, 2005

(30) Foreign Application Priority Data
Nov. 7, 2003 (KR) .................. 10-2003-0078605

(51) Int. Cl.
*H04N 5/445* (2006.01)
(52) U.S. Cl. ................. 348/731; 348/563; 348/569; 348/732; 725/37
(58) Field of Classification Search ........... 348/731, 348/732, 563, 569, 570; 725/37, 38
See application file for complete search history.

(56) References Cited

U.S. PATENT DOCUMENTS

| | | | | | |
|---|---|---|---|---|---|
| 5,200,823 | A | * | 4/1993 | Yoneda et al. | 348/473 |
| 5,461,427 | A | * | 10/1995 | Duffield et al. | 348/555 |
| 5,990,883 | A | * | 11/1999 | Byrne et al. | 715/721 |
| 6,064,378 | A | * | 5/2000 | Chaney et al. | 725/39 |
| 6,177,931 | B1 | * | 1/2001 | Alexander et al. | 725/52 |
| 6,181,921 | B1 | * | 1/2001 | Konisi et al. | 455/186.2 |
| 6,313,886 | B1 | * | 11/2001 | Sugiyama | 348/731 |
| 6,321,382 | B1 | * | 11/2001 | Wugofski | 725/59 |
| 6,340,992 | B1 | * | 1/2002 | Markandey | 348/556 |
| 6,340,997 | B1 | * | 1/2002 | Borseth | 348/731 |
| 6,359,580 | B1 | * | 3/2002 | Morrison | 348/731 |
| 6,583,825 | B1 | * | 6/2003 | Yuen et al. | 348/731 |
| 6,621,528 | B1 | * | 9/2003 | Kessler et al. | 348/734 |
| 6,637,029 | B1 | * | 10/2003 | Maissel et al. | 725/46 |

(Continued)

FOREIGN PATENT DOCUMENTS

JP 2000-312157 11/2000

(Continued)

*Primary Examiner*—Brian P Yenke
(74) *Attorney, Agent, or Firm*—Stanzione & Kim, LLP

(57) ABSTRACT

A digital physical receiving apparatus and a receiving method thereof. The digital broadcasting receiving apparatus includes a channel information storage unit to store information on a receivable physical channel among physical channels allocated to discriminate digital broadcasting signals transmitted from a pluarlity of broadcasting stations, and a transceiver identification (Tx ID) allocated to discriminate a transceiving region of the broadcasting signal, an input unit to input a virtual channel of the digital broadcasting signal and a receiving region corresponding to a desired analog broadcasting channel, a control unit to select the physical channel having the inputted virtual channel and making a channel selecting priority list when a plurality of the physical channels are selected, and an on-screen display (OSD) processing unit to display the channel selecting priority list when the broadcasting signal of the first priority channel is displayed. When there are a plurality of the physical channels having the desired virtual channel, the control unit gives first priority to the physical channel having the same Tx ID as the received Tx ID, and determines a channel selecting priority with respect to the rest of the physical channels in an ascending order of the channel number, thereby solving a problem of overlap of the virtual channel.

13 Claims, 4 Drawing Sheets

U.S. PATENT DOCUMENTS

| | | | | |
|---|---|---|---|---|
| 6,700,624 B2* | 3/2004 | Yun | | 348/555 |
| 6,732,371 B1* | 5/2004 | Lee et al. | | 725/41 |
| 6,775,843 B1* | 8/2004 | McDermott | | 725/151 |
| 6,785,904 B1* | 8/2004 | Franken et al. | | 725/54 |
| 6,922,728 B2* | 7/2005 | Cho | | 709/227 |
| 6,978,471 B1* | 12/2005 | Klopfenstein | | 725/50 |
| 6,992,728 B2* | 1/2006 | Takagi et al. | | 348/569 |
| 6,993,782 B1* | 1/2006 | Newberry et al. | | 725/39 |
| 7,024,676 B1* | 4/2006 | Klopfenstein | | 725/49 |
| 7,027,106 B2* | 4/2006 | Takagi et al. | | 348/731 |
| 7,030,933 B2* | 4/2006 | Takagi et al. | | 348/569 |
| 7,050,117 B2* | 5/2006 | Takagi et al. | | 348/725 |
| 7,057,673 B1* | 6/2006 | Weber | | 348/734 |
| 7,084,926 B2* | 8/2006 | Yamanishi | | 348/569 |
| 7,084,930 B2* | 8/2006 | Okabe | | 348/731 |
| 7,092,044 B2* | 8/2006 | Inui et al. | | 348/732 |
| 7,154,564 B2* | 12/2006 | Kim | | 348/731 |
| 7,206,031 B2* | 4/2007 | Yamamoto et al. | | 348/731 |
| 7,221,411 B2* | 5/2007 | Tani et al. | | 348/731 |
| 7,230,655 B2* | 6/2007 | Nonomura | | 348/734 |
| 2002/0101541 A1* | 8/2002 | Takagi et al. | | 348/569 |
| 2002/0104085 A1* | 8/2002 | Takagi et al. | | 725/38 |
| 2002/0186327 A1* | 12/2002 | Inui et al. | | 348/732 |
| 2003/0056216 A1* | 3/2003 | Wugofski et al. | | 725/46 |
| 2003/0137605 A1* | 7/2003 | Chin et al. | | 348/569 |
| 2003/0233653 A1* | 12/2003 | Hwang et al. | | 725/38 |
| 2004/0061807 A1* | 4/2004 | Song | | 348/731 |
| 2004/0080672 A1* | 4/2004 | Kessler et al. | | 348/553 |
| 2004/0163108 A1* | 8/2004 | Takagi et al. | | 725/38 |
| 2005/0030229 A1* | 2/2005 | Spilker, Jr. | | 342/385 |
| 2005/0117070 A1* | 6/2005 | Wu et al. | | 348/725 |
| 2006/0033843 A1* | 2/2006 | Klopfenstein et al. | | 348/570 |

FOREIGN PATENT DOCUMENTS

| | | |
|---|---|---|
| JP | 2002-232801 | 8/2002 |
| KR | 1999-48281 | 7/1999 |
| KR | 2000-28049 A | 5/2000 |

* cited by examiner

FIG. 4

| PHYSICAL CHANNEL# | VIRTUAL CHANNEL# | RECEIVED Tx ID |
|---|---|---|
| CH20 | CH6 | |
| CH23 | CH7 | |
| CH29 | CH6 | O |
| CH40 | CH3 | |
| CH47 | CH9 | |
| CH49 | CH6 | |
| CH52 | CH11 | |

FIG. 5A

| 1 | CH20 |
|---|---|
| 2 | CH29 |
| 3 | CH49 |

FIG. 5B

| 1 | CH29 |
|---|---|
| 2 | CH20 |
| 3 | CH49 |

FIG. 6

| DETECTED CHANNEL BY DTV CH6 | |
|---|---|
| CH29 | SBS |
| CH20 | PSB * |
| CH49 | UBC * |

DIGITAL BROADCASTING RECEIVER AND A RECEPTION METHOD THEREOF

CROSS-REFERENCE TO RELATED APPLICATIONS

This application claims the benefit of Korean Application No. 2003-78605, filed Nov. 7, 2003, in the Korean Intellectual Property Office, the disclosure of which is incorporated herein by reference.

BACKGROUND OF THE INVENTION

1. Field of the Invention

The present general inventive concept relates to an apparatus used with a digital broadcasting receiving apparatus, and a reception method thereof. More particularly, the present general inventive concept relates to a digital broadcasting receiving apparatus capable of coping with a situation that occurs when there are a plurality of physical channels corresponding to one selected virtual channel, and a reception method thereof.

2. Description of the Related Art

As the digital industry has developed, standardization of digital broadcasting is under way also in television (TV) broadcasting. A transmitting end in a digital system compresses and encodes an image or a voice, and multiplexes the image or the voice as a single data stream. A receiving end corrects an error generated in the received data stream, demultiplexes and decodes the image and the voice to output the image and the voice.

One of characteristics of the digital broadcasting and the digital TV (DTV) is multi-channelization. While an analog system enables transmission of only one program to one bandwidth, the digital system enables transmission of about four programs to the same bandwidth. Thus, the digital system guarantees multiple channels as the above since the digital system employs a moving picture experts group (MPEG)-2 technology which enables high density compression and decompression of image and voice. Therefore, by the digital system, high quality image and sound effects, as provided at a movie theater, is obtainable even at home.

The multi-channelizing of the digital broadcasting allows a user to select a broadcasting signal of diverse and clear image qualities. In general, the user selects a desired channel using a remote controller or a channel selecting means mounted to a receiving apparatus body. The recent receiving apparatus is provided with an auto channel searching function in which the channels are automatically set without requiring a user's direct selection of the broadcasting channel. The auto channel searching function skips channels where the broadcasting signal is not received or is rarely received, and automatically sets channels where the broadcasting signal is received.

However, a physical channel of the DTV has a drawback in that the user has to additionally be aware of channel numbers of the DTV. Accordingly, virtual channel is used to reduce the user's burden of recognizing a lot of channels, and utilizes existing channel numbers which are already well known to the audience. The virtual channels correspond to channels allotted to the respective analog broadcasting signals. For example, in Korea as of August, 200,3 the virtual channel numbers 9, 7, 13, 11, 6 and 8 are allocated respectively to broadcasting stations KBS1, KBS2, EBS, MBC, SBS (non-government broadcasting) and iTV.

According to domestic DTV broadcasting regulations, each broadcasting station employs different physical transport channels (PTC) for broadcasting. The PTC is divided by regional groups. By way of example, the PTC of MBC in Seoul, the capital of Korea, is 15 while the PTC of MBC in Cheongju, which is another city in Korea, is 20. However, in the domestic digital broadcasting, since local broadcasting stations are not equipped with conditions for producing digital contents by themselves, the local broadcasting stations usually retransmit the broadcasting signal of the main broadcasting station. Relay centers established in places also receive the broadcasting signal from the broadcasting stations, and retransmit the signal to the respectively allocated PTCs.

As described above, when one virtual channel is used in many different places, a plurality of broadcasting signals having the same virtual channel may be received in some places. Therefore, if the user selects the virtual channel of this kind of broadcasting signal, it becomes hard to determine the physical channel to be selected on the digital broadcasting receiving apparatus. As a result, solutions are required for when the signals are overlapped over a virtual channel.

SUMMARY OF THE INVENTION

An aspect of the present general inventive concept is to solve at least the above problems and/or disadvantages and to provide at least the advantages described below. Accordingly, an aspect of the present general inventive concept is to provide a convenient apparatus to receive digital broadcasting, which prevents confusion in selecting channels by giving priority to the plurality of the physical channels in certain order when there are a plurality of physical channels having the same virtual channel, and displaying a channel list and broadcasting information of other regions on an on screen display (OSD).

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept are achieved by providing a digital broadcasting receiving apparatus comprising a channel information storage unit to store information on a receivable physical channel among physical channels allocated to discriminate digital broadcasting signals transmitted from a plurality of broadcasting stations, and a transceiver identification (Tx ID) allocated to discriminate a transceiving region of the broadcasting signal, an input unit to input a virtual channel of the digital broadcasting signal and a receiving region corresponding to a desired analog broadcasting channel, a control unit to select the physical channel having the inputted virtual channel, making a channel selecting priority list when a plurality of the physical channels are selected, and controlling the overall system to select and display the broadcasting signal of the first priority channel, and an on-screen display (OSD) processing unit to display the channel selecting priority list when the broadcasting signal of the first priority channel is displayed.

The control unit may comprise a comparison unit to compare the virtual channel of the respective physical channels with the inputted virtual channel to select the physical channel having the same virtual channel as the inputted virtual channel, a counter to count the number of the physical channels selected at the comparison unit, and a processor to make a channel selecting priority list when a plurality of physical channels are counted, by arranging the plurality of physical channels in an ascending order.

The comparison unit compares a received Tx ID with a transmitted Tx ID of the physical channel having the virtual channel to select the physical channel having the same Tx ID as the received Tx ID. If the transmitted Tx ID of the physical channel having the virtual channel is the same as the received Tx ID, the processor readjusts the channel selecting priority list so that the physical channel is given the first priority.

The OSD processing unit displays the channel selecting priority list and a label indicating that the broadcasting channel is of other regions through the OSD screen.

The foregoing and/or other aspects and advantages of the present general inventive concept are also achieved by providing a receiving method of digital broadcasting comprising the operations of inputting a receiving region to a system through an inputting device, the system which includes a Tx ID allocated to discriminate respective transceiving regions, setting a channel by scanning a receivable physical channel among physical channels allocated to discriminate digital broadcasting signals transmitted from a plurality of broadcasting stations, and storing information on the set physical channel, inputting a virtual channel of the digital broadcasting signal corresponding to a desired analog broadcasting channel through an inputting device, detecting the physical channel having the same virtual channel as the inputted virtual channel, if a plurality of the physical channels are detected, making a channel selecting priority list of the plurality of physical channels, and displaying the channel selecting priority list through an OSD screen when the broadcasting signal of the first priority channel is displayed.

The operation of detecting the physical channel may comprise the operations of comparing the virtual channel of the respective physical channels with the inputted virtual channel to select the physical channel having the same virtual channel as the inputted virtual channel, detecting the physical channel having the same virtual channel as the inputted virtual channel, and counting the number of the detected physical channels.

The operation of making a channel selecting priority list may comprise the operations of arranging the plurality of physical channels having the virtual channel in an ascending order, comparing the transmitted Tx ID of the plurality of physical channels with the received Tx ID, and readjusting the channel selecting priority list so that the physical channel having the same Tx ID as the received Tx ID is given the first rank.

The physical channel having a different Tx ID from the received Tx ID is labeled and displayed as the broadcasting channel of other regions through the OSD screen.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 4 shows an example of an overlapped virtual channel;

FIG. 5A shows a channel selecting priority list in operation S250 of FIG. 3 in case of FIG. 4;

FIG. 5B shows a channel selecting priority list in operation S270 of FIG. 3 in case of FIG. 4; and FIG. 6 shows an example of an on screen display (OSD) in case of FIG. 4.

DETAILED DESCRIPTION OF THE PREFERRED EMBODIMENTS

Figure 1:
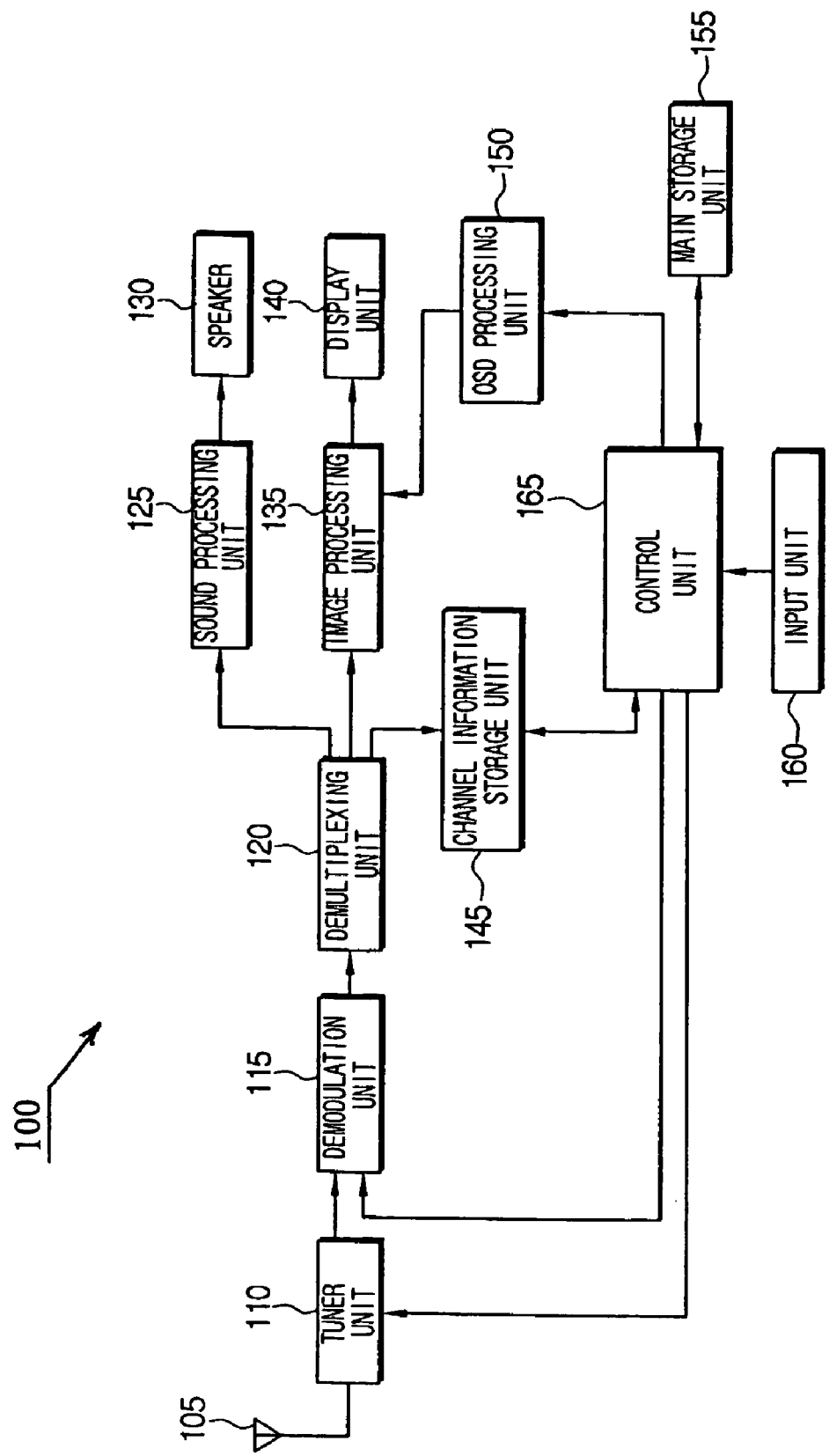
FIG. 1 is a block diagram of a digital broadcasting receiving apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram illustrating a digital broadcasting receiving apparatus 100 according to an embodiment of the present general inventive concept. Referring to FIG. 1, the digital broadcasting receiving apparatus comprises an antenna 105, a tuner unit 110, a demodulation unit 115, a demultiplexing unit 120, a sound processing unit 125, a speaker 130, an image processing unit 135, a display unit 140, a channel information storage unit 145, an on screen display (OSD) processing unit 150, a main storage unit 155, an input unit 160, and a control unit 165.

When a physical channel scanning command is inputted to provide system initialization, the tuner unit 110 sets the channel by sequentially tuning from the lowest channel to the highest channel by an auto channel searching function in which the channels are automatically set. The tuner unit 110 selects a digital signal for the channel selected by the user, among a plurality of digital signals received over the antenna 105. The digital signal includes a digital broadcasting signal and diverse information on the digital broadcasting signal.

The demodulation unit 115 demodulates a modulated signal inputted from the tuner unit 110 to a base band signal.

The demultiplexing unit 120 separates the signal inputted from the demodulation unit 115 respectively into a video signal, an audio signal and an information signal with respect to the broadcasting signal. Since the signals inputted from the demodulation unit 115 are multiplexed in a transmission packet form, the signals should be separated into a video signal, an audio signal and an information signal with respect to the broadcasting signal by demultiplexing.

The video signal output from the demultiplexing unit 120 is inputted to the image processing unit 135, and the audio signal is inputted to the sound processing unit 125. The information signal with respect to the broadcasting signal, especially, broadcasting channel information such as virtual channel information, physical channel information and transmitted (Tx) identification (ID) information, is stored at the channel information storage unit 145.

The sound processing unit 125 decodes the audio signal inputted from the demultiplexing unit 120, and then generates a sound data of an analog form. The sound data generated by the sound processing unit 125 is output externally through the speaker 130.

The image processing unit 135 decodes the video signal received from the demultiplexing unit 120, and then generates an image data displayable through the display unit 140 by encoding the decoded video signal by a red-green-blue (RGB) format. The image data generated by the image processing unit 135 is displayed through the display unit 140.

The image processing unit 135 may process the RGB signal inputted from the OSD processing unit 150 to overlap the image signal displayed through the display unit 140 according to a control of the control unit 165, which will be described below.

The channel information storage unit 145 stores channel information of the broadcasting signal. The broadcasting channel information includes the physical channel information, the virtual channel information, and the Tx ID information. The Tx ID information relates to a code allocated for discrimination of transceiving regions of the broadcasting signal. The transmitted broadcasting signal includes the Tx ID.

The OSD processing unit 150 generates the RGB signal to generate an OSD screen according to digital data supplied by the control unit 165, and outputs the RGB signal to the image processing unit 135. As described above, the image processing unit 135 generates, as the OSD screen, the RGB signal supplied from the OSD processing unit 150.

The main storage unit 155 stores a control program that controls and manages overall tuning of the digital broadcasting receiving apparatus 100.

The input unit 160 is equipped with a plurality of function keys to select various functions offered by the digital broadcasting receiving apparatus 100, number keys and direction keys. The input unit 160 enables the user to input a desired virtual channel number and receiving region.

Figure 2:
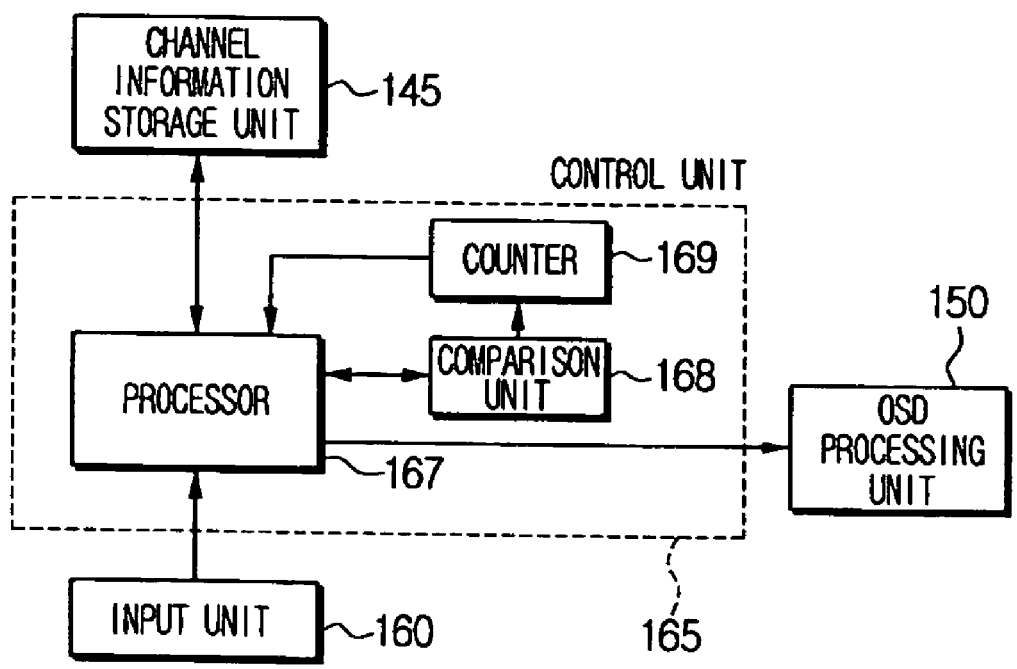
FIG. 2 is a block diagram of a control unit of the digital broadcasting receiving apparatus of FIG. 1, according to an embodiment of the present general inventive concept.

FIG. 2 is a block diagram of the control unit 165 of FIG. 1, which comprises a processor 167, a comparison unit 168 and a counter 169.

The processor 167 selects, at the channel information storage unit 145, the Tx ID corresponding to the receiving region inputted from the input unit 160, and stores the selected Tx ID at the channel information storage unit 145. Upon being inputted with a predetermined virtual channel, the processor 167 gives priority in certain order to the plurality of the physical channels having the same virtual channel, and sends the priority list to the OSD processing unit 150.

The comparison unit 168 compares the virtual channel inputted by the input unit 160 with the virtual channel of the physical channels stored in the channel information storage unit 145, respectively. If it is detected that the physical channels have the same virtual channel as the inputted virtual channel, the comparison unit 168 sends a signal regarding this detection to the counter 169 and the processor 167. Also, the comparison unit 168 compares the Tx ID of the physical channels having the same virtual channel as the inputted virtual channel with the received Tx ID, and detects physical channels having the same Tx ID as the received Tx ID.

The counter 169 counts the number of the signals inputted from the comparison unit 168, and sends the information on the number of the physical channels which have the inputted virtual channel to the processor 167.

The processor 167 determines a channel to be selected based on the information inputted from the comparison unit 168 and the counter 169. If there are two or more physical channels having the inputted virtual channel, one physical channel to be selected is determined among these physical channels. In this embodiment, the priority for selecting the channel is determined according to the physical channel number in an ascending order. The channel selecting priority list is stored in the channel information storage unit 145. If there exists a physical channel having the same Tx ID as the received Tx ID among the selected physical channels, the priority list is readjusted so that the physical channel is given the first priority. The processor 167 applies a control signal to the tuner unit 110 to select the first priority channel, and inputs the information on the channel selecting priority list to the OSD processing unit 150. When the first priority channel is displayed on the display unit 140, the OSD screen is displayed on a part of the display unit 140. Among the plurality of the physical channels displayed on the OSD screen, the channel corresponding to the broadcasting of other regions is labeled for the recognition by the user. For the label, a name of the regions may be displayed for a user's convenience.

When only one physical channel having the inputted virtual channel is detected, the detected channel is selected, the physical channel information is displayed through the OSD during display of the image signal, and the physical channel corresponding to the broadcasting of other regions is labeled. If there is no physical channel having the inputted virtual channel detected, the display unit 140 may show a message of "none received."

Figure 3:
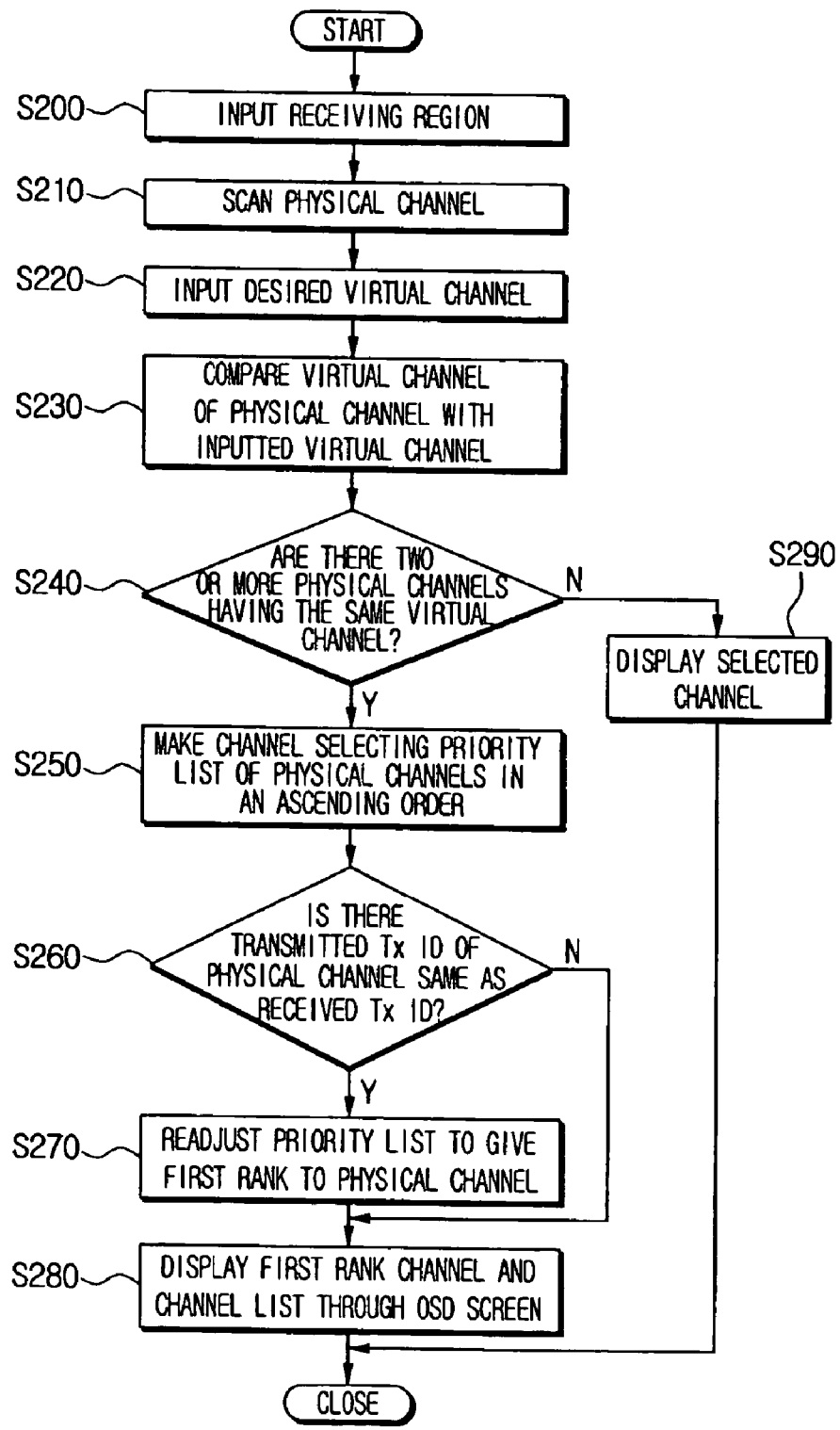
FIG. 3 is a flowchart illustrating a method of receiving digital broadcasting according to an embodiment of the present general inventive concept.

FIG. 3 is a flowchart illustrating a method of receiving digital broadcasting according to an embodiment of the present general inventive concept.

Referring to FIG. 3, a receiving region is inputted by a user through an operation key of the input unit 160, and the system is initialized, in operation S200. The Tx ID to discriminate the respective regions are allocated to the respective predetermined region. The Tx ID information may be preset in the system. If the Tx ID information is additionally inputted later, the Tx ID information also can be updated by transmitting the additional information together with the broadcasting signal. When the receiving region is inputted, the control unit 165 reads the received Tx ID corresponding to the receiving region inputted from the preset data, and stores the read Tx ID at the channel information storage unit 145.

According to a system initializing command, the whole channel range is sequentially tuned from the lowest channel to the highest channel, thereby setting a receivable channel in the present receiving region, in operation S210. The information on the set channels is stored at the channel information storage unit 145. The stored information includes information on the physical channel, the virtual channel, and the transmitted Tx ID of the respective channels.

When the desired virtual channel is inputted through the input unit 160 in operation S210, the processor 167 reads the information on the physical channel, the virtual channel, and the transmitted Tx ID of the respective channels, and sends the read information to the comparison unit 168. The comparison unit 168 compares the inputted virtual channel with the virtual channel of the respective physical channels, and if the two virtual channels are identical, outputs a signal regarding this to the counter 169. The counter 169 counts the number of the signals. If it is determined that there exist physical channels having the same virtual channel, the comparison unit 168 inputs physical channel information regarding this determination to the processor 167, in operation S230.

If it is determined that the number of the counted signal is equal to or more than two in operation S240, the processor 167 arranges the physical channels which have the same virtual channel as the inputted virtual channel in an ascending order in operation S250, thus making a priority list.

The comparison unit 168 compares the received Tx ID with the transmitted Tx ID of the physical channels having the inputted virtual channel to determine whether the two Tx IDs are identical in operation S260. As a result of the comparison, if there exist physical channels having the same transmitted Tx ID as the received Tx ID, the comparison unit 168 inputs a corresponding physical channel number to the processor 167. The processor 167 inputted with the physical channel number readjusts the channel selecting priority so that the physical channel is given the first rank, in operation S270.

The broadcasting image signal of the first rank channel is displayed through the display unit 140, and the OSD of the list of the physical channels having the same virtual channel as the inputted virtual channel is displayed on a part of the display unit 140 during display of the image signal, in operation S280. The channel corresponding to the broadcasting of other regions is labeled.

If there is no overlapped virtual channel, the broadcasting image signal of the selected channel is displayed, and the information on the displayed channel is displayed through the OSD screen in operation 290. The channel corresponding to the broadcasting of other regions is labeled.

Hereinbelow, the channel selection in accordance to the inputted virtual channel will be described in greater detail. FIG. 4 shows physical channels receivable by the system in the present region, and the virtual channels corresponding to the physical channels. For example, if the user inputs a virtual channel of a channel 6 which refers to a broadcasting station SBS, the comparison unit 168 compares the virtual channel of the respective physical channels with the inputted channel 6, and inputs the physical channels having the inputted virtual channel 6, such as a channel 20 transmitted by a broadcasting station PSB, a channel 29 transmitted by a broadcasting station SBS and a channel 49 transmitted by a broadcasting station UBS, to the processor 167. Additionally, the counter 169 inputs a signal to the processor 167, indicating that three virtual channels are overlapped. The processor 167 arranges the physical channels in an ascending order in order to determine the channel selecting priority with respect to the three channels, as shown in FIG. 5A. If the transmitted Tx ID of the physical channel of the channel 29 is the same as the received Tx ID, the channel 29 is given the first rank, and the channel selecting priority is determined as shown in FIG. 5B. Accordingly, the channel 29 is selected and displayed. While the broadcasting signal of the selected channel is displayed, the broadcasting channel information is displayed on a part of the OSD screen. On the OSD screen, as shown in FIG. 6, a list of the physical channels detected by the virtual channel 6 is displayed. The broadcasting stations PSB and UBC are labeled as the broadcastings of other regions. The broadcasting stations may be labeled by name of the region.

As can be appreciated from the above description of the digital broadcasting receiving apparatus and the receiving method, when there are a plurality of physical channels corresponding to one desired virtual channel, that is, when an overlap of the virtual channel occurs, the channel selecting priority is set to solve a problem caused by the overlap. In addition, by displaying the list of the selectable physical channels and the broadcasting region through the OSD screen, the user can recognize available channels with convenience.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A digital broadcasting receiving apparatus comprising:
   a channel information storage unit to store information on a receivable physical channel among physical channels allocated to discriminate digital broadcasting signals transmitted from a plurality of broadcasting stations and a transceiver identification (Tx ID) allocated to discriminate a transceiving region of the broadcasting signal;
   an input unit to input a virtual channel and a receiving region Tx ID of a desired digital broadcasting signal;
   a control unit to select a physical channel having the inputted virtual channel among a plurality of physical channels selected which also have the inputted virtual channel, to make a channel selecting priority list when a plurality of the physical channels are selected, and to control the overall system to select and display the broadcasting signal of the first priority channel; and
   an on-screen display (OSD) processing unit to display the channel selecting priority list when the broadcasting signal of the first priority channel is displayed,
   wherein the control unit compares the received Tx ID with transmitted Tx ID of the physical channel having the virtual channel such that if the transmitted Tx ID is the same as the received Tx ID, the control unit arranges the plurality of physical channel in a list so that the physical channel of the transmitted Tx ID is given a first priority.

2. The digital broadcasting receiving apparatus of claim 1, wherein the control unit comprises:
   a comparison unit to compare the virtual channel of the respective physical channels with the inputted virtual channel to select the physical channel having the same virtual channel as the inputted virtual channel;
   a counter to count the number of the physical channels selected at the comparison unit; and
   a processor to make a channel selecting priority list when a plurality of physical channels are counted by arranging the plurality of physical channels in an ascending order.

3. The digital broadcasting receiving apparatus of claim 2, wherein the comparison unit compares a received Tx ID with a transmitted Tx ID of the physical channel having the virtual channel to select the physical channel having the same Tx ID as the received Tx ID.

4. The digital broadcasting receiving apparatus of claim 3, wherein if the transmitted Tx ID of the physical channel having the virtual channel is the same as the received Tx ID, the processor readjusts the channel selecting priority list so that the physical channel is given the first priority.

5. The digital broadcasting receiving apparatus of claim 1, wherein the OSD processing unit displays the channel selecting priority list and a label indicating that broadcasting channel is of other regions through an OSD screen.

6. A method of receiving digital broadcasting, comprising the operations of:
   inputting a receiving region to a system through an inputting device, the system including a Tx ID allocated to discriminate respective transceiving regions;
   setting a channel by scanning a receivable physical channel among physical channels allocated to discriminate digital broadcasting signals transmitted from plurality of broadcasting stations, and storing information on the set physical channel;
   inputting a virtual channel of the digital broadcasting signal corresponding to a desired analog broadcasting channel through an inputting device;
   detecting the physical channel having the same virtual channel as the inputted virtual channel;
   if a plurality of the physical channels are detected, making a channel selecting priority list of the plurality of physical channels;
   comparing a transmitted Tx ID of the plurality of physical channels with the system Tx ID;
   readjusting the channel selecting priority list so that the physical channel having the same transmitted Tx ID as the system Tx ID is given the first priority, and
   displaying the channel selecting priority list through an OSD screen when the broadcasting signal of the first priority channel is displayed.

7. The method of claim 6, wherein the operation of detecting the physical channel comprises the operations of:

comparing the virtual channel of the respective physical channels with the inputted virtual channel to select the physical channel having the same virtual channel as the inputted virtual channel;

detecting the physical channel having the same virtual channel as the inputted virtual channel; and counting the number of the detected physical channels.

8. The method of claim 6, wherein the operation of making a channel selecting priority list comprises the operations of:

arranging the plurality of physical channels having the virtual channel in an ascending order.

9. The method of claim 6, wherein the physical channel having a different Tx ID from the received Tx ID is labeled and displayed the broadcasting channel of other regions through the OSD screen.

10. An apparatus used with a digital broadcasting receiving apparatus, comprising:

a channel information storage unit to store information on a receivable physical channel among physical channels allocated to discriminate digital broadcasting signals transmitted from a plurality of broadcasting stations and a transceiver identification (Tx ID) allocated to discriminate a transceiving region of the broadcasting signal;

an input unit to input a desired virtual channel number and receiving region (Tx ID);

a control unit to compare the virtual channel of the respective physical channels with the inputted virtual channel to select the physical channel having the same virtual channel as the inputted virtual channel, to count the number of the physical channels selected at the comparison unit, and to make a channel selecting priority list when a plurality of physical channels are counted by arranging the plurality of physical channels in an ascending order; and an on-screen display (OSD) processing unit to display the channel selecting priority list when the broadcasting signal of the first priority channel is displayed.

wherein the control unit compares the inputted Tx ID with the transmitted Tx ID of The physical channel having the virtual channel to select the physical channel having the same Tx ID as the inputted Tx ID, and wherein if the transmitted Tx ID of the physical channel having the virtual channel is the same as the inputted Tx ID the control unit readjusts the channel selecting priority list so that the physical channel having the same Tx ID is given the first priority.

11. The apparatus of claim 10, wherein the OSD processing unit displays the channel selecting priority list and a label indicating that the broadcasting channel is of other regions through an OSD screen.

12. A digital broadcasting receiving apparatus comprising:

a channel information storage unit to store information on a receivable physical channel among physical channels allocated to discriminate digital broadcasting signals transmitted from a plurality of broadcasting stations, the information including physical channel information, virtual channel information, and a transceiver identification (TX ID) allocated to discriminate a transceiving region of the broadcasting signal;

an input unit to input a desired virtual channel corresponding to the virtual channel information received by the receiving apparatus, and a receiving region (Tx ID) corresponding to a desired analog broadcasting channel;

a control unit to select the desired physical channel based on the inputted virtual channel, to make a channel selecting priority list when a plurality of the physical channels are selected, and to control the overall system to select and display the broadcasting signal of the first priority channel; and an on-screen display (OSD) processing unit to display the channel selecting priority list when the broadcasting signal of the first priority channel is displayed, wherein the control unit compares the inputted Tx ID with the transmitted Tx ID of the physical channel having the virtual channel to select the physical channel having the same Tx ID as the inputted Tx ID, and wherein if the transmitted Tx ID of the physical channel having the virtual channel is the same as the inputted Tx ID, the control unit readjusts the channel selecting priority list so that the physical channel having the same Tx ID is given the first priority.

13. The apparatus of claim 12, wherein the digital broadcasting signals are multiplexed in a transmission packet form to include an information signal comprising the physical channel information, the virtual channel information, and the transceiver identification (Tx ID).

* * * * *

UNITED STATES PATENT AND TRADEMARK OFFICE
CERTIFICATE OF CORRECTION

PATENT NO.       : 7,639,310 B2
APPLICATION NO.  : 10/978371
DATED            : December 29, 2009
INVENTOR(S)      : Eun-young Kang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1056 days.

Signed and Sealed this

Twenty-first Day of December, 2010

David J. Kappos
*Director of the United States Patent and Trademark Office*